US012580578B2

(12) United States Patent
Kamble et al.

(10) Patent No.: US 12,580,578 B2
(45) Date of Patent: Mar. 17, 2026

(54) POWER OPTIMIZED SIGNAL CHAIN FOR LOW OFFSET DRIFT

(71) Applicant: Analog Devices International Unlimited Company, Limerick (IE)

(72) Inventors: Maitrey Shridhar Kamble, Mumbai (IN); Mahesh Madhavan, Kerala (IN); Brian Jadus, Williston, VT (US); Anoop Kalathil, Kuttippuram (IN); Jesper Steensgaard, Sequim, WA (US); Damien J. McCartney, Raheen (IE)

(73) Assignee: Analog Devices International Unlimited Company, Limerick (IE)

( * ) Notice: Subject to any disclaimer, the term of this patent is extended or adjusted under 35 U.S.C. 154(b) by 109 days.

(21) Appl. No.: 18/671,175

(22) Filed: May 22, 2024

(65) Prior Publication Data

US 2025/0365002 A1 Nov. 27, 2025

(51) Int. Cl.
*H03M 1/12* (2006.01)

(52) U.S. Cl.
CPC .................................. *H03M 1/1245* (2013.01)

(58) Field of Classification Search
CPC ...................................................... H03M 1/1245
USPC .................................. 341/118, 122, 143, 155
See application file for complete search history.

(56) References Cited

U.S. PATENT DOCUMENTS

| | | | |
|---|---|---|---|
| 5,675,334 A | 10/1997 | McCartney | |
| 8,269,657 B2 * | 9/2012 | Anthony .............. | H03M 1/0607 |
| | | | 341/120 |
| 8,791,754 B2 | 7/2014 | Lyden et al. | |
| 8,947,284 B2 * | 2/2015 | Ishii .................... | H03M 1/1023 |
| | | | 341/120 |

(Continued)

FOREIGN PATENT DOCUMENTS

JP 2012074919 A 4/2012

OTHER PUBLICATIONS

Brewer et al., A 100dB SNR 2.5 MS/s output data rate ΔΣ CADC. IEEE International Digest of Technical Papers, Solid-State Circuits Conference (ISSCC), Feb. 2005 (pp. 172-591), 3 pages.

(Continued)

*Primary Examiner* — Khai M Nguyen

(74) *Attorney, Agent, or Firm* — Schwegman Lundberg & Woessner, P.A.

(57) ABSTRACT

Described herein are techniques that improve efficiency of analog-to-digital conversion circuits by reducing idling time, during which the ADC circuit is not converting an analog signal to a digital representation, which reduces associated power consumption from keeping the ADC circuit running during idling time. In some embodiments, chop circuits may be used in combination with a plurality of track-and-hold circuits to acquire one polarity of an input signal and convert another polarity of the input signal during a same sampling period. A chop circuit may be configured to alternate between generating a first polarity of the input signal and a second polarity of the input signal. A first T/H circuit may be configured to acquire one polarity of the input signal from the chop circuit while a second T/H circuit provides another polarity of the input signal, previously acquired from the chop circuit, to an ADC for conversion.

20 Claims, 12 Drawing Sheets

(56)                 References Cited

U.S. PATENT DOCUMENTS

| 11,082,056 B2 | 8/2021 | Bodnar et al. |
| 2023/0392991 A1 | 12/2023 | Wang |

OTHER PUBLICATIONS

"European Application Serial No. 25176669.7, Extended European Search Report mailed Oct. 21, 2025", 16 pgs.

Fathy, Nader Sherif Kassem, et al., "A 0.00179 mm2/Ch Chopper-Stabilized TDMA Neural Recording System With Dynamic EOV Cancellation and Predictive Mixed-Signal Impedance Boosting", IEEE Transactions on Biomedical Circuits and Systems, IEEE, US, vol. 18, No. 4, (Feb. 22, 2024), 908-922.

Shen, Ding-Lan, et al., "Architecture of a mixed-mode electrophysiological signal acquisition interface", Engineering in Medicine and Biology Society (EMBC), 2013 34th Annual International Conference of the IEEE, (Aug. 28, 2012), 3388-3391.

T., Rahul, et al., "A Wide Dynamic-Range Low-Power Signal Conditioning Circuit for Low-Side Current Sensing Application", IEEE 27th International Conference On VLSI Design and 2014 13th International Conference on Embedded Systems, (Jan. 3, 2015), 265-270.

Yoon, Younghyun, et al., "A Delta-Sigma Modulator for Low-Power Analog Front Ends in Biomedical Instrumentation", IEEE Transactions on Instrumentation and Measurement, USA, vol. 65, No. 7, (Jul. 1, 2016), 1530-1539.

\* cited by examiner $$Gain = \frac{C_{in}}{C_{fb}}$$

$$Gain = \frac{R_{fb}}{R_{in}}$$

POWER OPTIMIZED SIGNAL CHAIN FOR LOW OFFSET DRIFT

BACKGROUND

Field

The present disclosure relates to analog-to-digital conversion (ADC) circuitry.

Related Art

ADC circuitry is used to generate digital representations of analog signals. For example, analog signals may be received from an analog sensor and converted into a digital representation for processing using digital signal processing circuitry, such as a digital controller. For instance, one potential use for ADC circuitry is in a motor control system to interface between an analog motor sensor and a digital motor controller.

An ADC typically operates by sampling (e.g., using a capacitor) the voltage or current level of an input analog signal over time and encoding the voltage or current level into one or more digital bits representing the voltage or current level at a given time. A delta sigma modulated ADC oversamples an input analog signal and outputs one (or a small number of) digital bits representing the voltage or current level of the analog signal, which may be subsequently demodulated to obtain a greater number of digital bits representing the voltage or current level of the analog signal. A successive approximation register ADC iteratively analyzes a sampled analog signal to gradually identify an approximate voltage or current level of the analog signal, which may be output using multiple digital bits.

BRIEF SUMMARY

Described herein are techniques that improve efficiency of analog-to-digital conversion (ADC) circuits by reducing idling time, during which the ADC circuit is not converting an analog signal to a digital representation, which reduces associated power consumption from keeping the ADC circuit running during idling time. In some embodiments, chop circuits may be used in combination with a plurality of track-and-hold (T/H) circuits to acquire one polarity of an input signal and convert another polarity of the input signal during a same sampling period. A chop circuit may be configured to alternate between generating a first polarity of the input signal (e.g., as received) and a second polarity of the input signal (e.g., inverted with respect to as received). A first T/H circuit may be configured to acquire one polarity of the input signal from the chop circuit while a second T/H circuit provides another polarity of the input signal, previously acquired from the chop circuit, to an ADC for conversion.

Some embodiments relate to an analog-to-digital conversion (ADC) circuit, comprising: a first chop circuit configured to receive an input signal and generate a first polarity of the input signal during a first sampling period and a second polarity of the input signal during a second sampling period; a first track-and-hold (T/H) circuit configured to acquire the first polarity of the input signal from the first chop circuit during the first sampling period and acquire the second polarity of the input signal from the first chop circuit during the second sampling period; a second T/H circuit configured to output the second polarity of the input signal from the first chop circuit during the first sampling period and output the first polarity of the input signal from the first chop circuit during the second sampling period; an ADC configured to convert the second polarity of the input signal from the second T/H circuit to one or more first digital bits during the first sampling period and convert the first polarity of the input signal from the second T/H circuit to one or more second digital bits during the second sampling period; and a second chop circuit configured to produce a digital representation of the input signal over the first sampling period and the second sampling period using the one or more first digital bits and the one or more second digital bits.

In some embodiments, the first T/H circuit is further configured to output the first polarity of the input signal from the first chop circuit during a third sampling period and output the second polarity of the input signal from the first chop circuit during a fourth sampling period; and the second T/H circuit is configured to acquire the first polarity of the input signal from the first chop circuit during the third sampling period and acquire the second polarity of the input signal from the first chop circuit during the fourth sampling period.

In some embodiments, the first T/H circuit and the second T/H circuit are each coupled between the first chop circuit and the ADC.

In some embodiments, the ADC circuit further comprises a signal conditioning circuit coupled between the first chop circuit and the first T/H circuit and between the first chop circuit and the second T/H circuit.

In some embodiments, the signal conditioning circuit comprises a capacitive gain amplifier (CGA).

In some embodiments, the ADC circuit further comprises: a third chop circuit configured to receive a second input signal and generate a first polarity of the second input signal during a third sampling period and a second polarity of the second input signal during a fourth sampling period, wherein the first T/H circuit and the second T/H circuit are included in a plurality of T/H circuits, and the ADC circuit further comprises control circuitry configured to select among the plurality of T/H circuits to acquire one of the first polarity of the input signal, the second polarity of the input signal, the first polarity of the second input signal, and the second polarity of the second input signal.

In some embodiments, the ADC comprises a successive approximation register (SAR) ADC.

In some embodiments, the ADC circuit is further configured to: transmit, over an isolation barrier, a modulated version of the digital representation of the input signal; and receive, over the isolation barrier, a clock signal for controlling timing of a transition between sampling periods.

In some embodiments, the first chop circuit and the second chop circuit are configured to operate over a chop period that is longer than or equal to twice the first sampling period and the second sampling period; and the first T/H circuit and the second T/H circuit are configured to operate over a T/H period that is shorter than the chop period.

Some embodiments relate to a method of analog-to-digital conversion (ADC), comprising: during a first sampling period: generating, using a first chop circuit, a first polarity of an input signal; acquiring the first polarity of an input signal at a first track-and-hold (T/H) circuit; and converting, using an ADC, a second polarity of the input signal from a second T/H circuit to one or more first digital bits; during a second sampling period: generating, using the first chop circuit, the second polarity of the input signal; acquiring the second polarity of the input signal at the first T/H circuit; and converting, using the ADC, the first polarity of the input signal from the second T/H circuit to one or more second digital bits; and producing, using a second chop circuit, a digital representation of the input signal over the first sampling period and the second sampling period using the one or more first digital bits and the one or more second digital bits.

In some embodiments, the method further comprises: during a third sampling period, acquiring the first polarity of the input signal at the second T/H circuit and converting, using the ADC, the first polarity of the input signal from the first T/H circuit to one or more third digital bits; during a fourth sampling period, acquiring the second polarity of the input signal at the second T/H circuit and converting, using the ADC, the second polarity of the input signal from the first T/H circuit to one or more fourth digital bits; and producing, using the second chop circuit, the digital representation of the input signal over the third sampling period using the one or more third digital bits and over the fourth sampling period using the one or more fourth digital bits.

In some embodiments, the first T/H circuit and the second T/H circuit are each coupled between the first chop circuit and the ADC.

In some embodiments, the method further comprises, using a capacitive gain amplifier (CGA) coupled between the first chop circuit and the first T/H circuit and between the first chop circuit and the second T/H circuit: during the first sampling period, conditioning the first polarity of the input signal; and during the second sampling period, conditioning the second polarity of the input signal.

In some embodiments, the method further comprises: transmitting, over an isolation barrier, a modulated version of the digital representation of the input signal; and receiving, over the isolation barrier, a clock signal for controlling timing of a transition between sampling periods.

In some embodiments, the first chop circuit and the second chop circuit operate over a chop period that is longer than or equal to the first sampling period and the second sampling period; and the first T/H circuit and the second T/H circuit operate over a T/H period that is shorter than the chop period.

Some embodiments relate to an analog-to-digital conversion (ADC) circuit, comprising: a first chop circuit configured to receive and chop an input signal to produce a chopped input signal; a plurality of track-and-hold (T/H) circuits coupled to the first chop circuit to receive the chopped input signal and output a portion of the chopped input signal; an ADC coupled to the plurality of T/H circuits to receive the portion of the chopped input signal and output a digital representation of the portion of the chopped input signal; and a second chop circuit coupled to the ADC and configured to output a digital representation of the input signal.

In some embodiments, the ADC circuit further comprises a signal conditioning circuit coupled between the first chop circuit and the plurality of T/H circuits.

In some embodiments, the signal conditioning circuit comprises a capacitive gain amplifier (CGA).

In some embodiments, the ADC comprises a successive approximation register (SAR) ADC.

In some embodiments, the first chop circuit and the second chop circuit are configured to receive a chop signal having a first frequency; the ADC is configured to receive a conversion timing signal having a second frequency; and the second frequency is higher than the first frequency.

In some embodiments, the ADC circuit further comprises: transmission circuitry coupled to the second chop circuit and configured to transmit the digital representation of the input signal over an isolation barrier, wherein the ADC circuit is configured to receive a clock signal over the isolation barrier and operate the first chop circuit, the second chop circuit, and the ADC based on the clock signal.

BRIEF DESCRIPTION OF DRAWINGS

Various aspects and embodiments of the application will be described with reference to the following figures. It should be appreciated that the figures are not necessarily drawn to scale.

Items appearing in multiple figures are indicated by the same reference number in all the figures in which they appear.

DETAILED DESCRIPTION

Figure 1A:
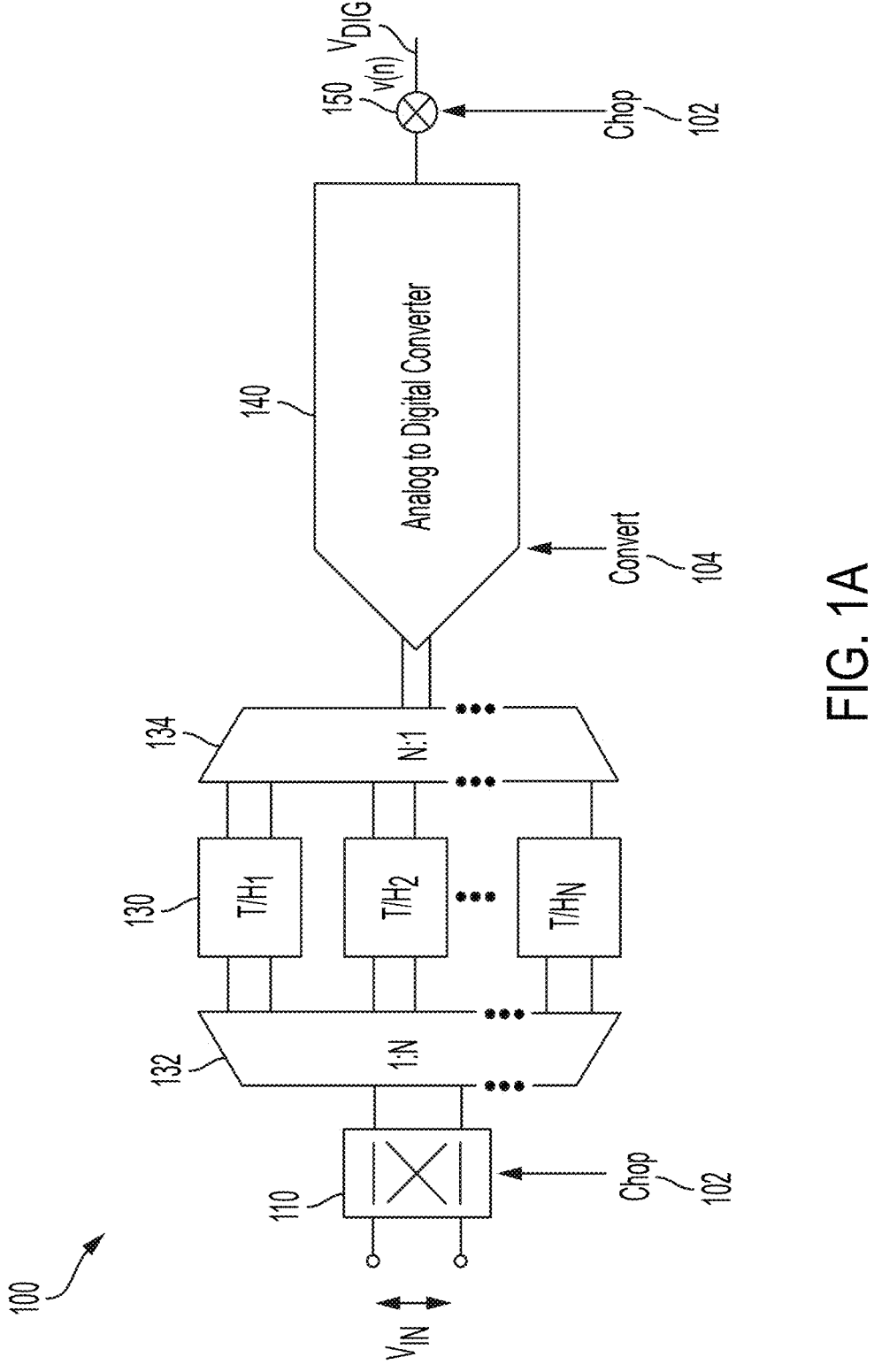
FIG. 1A is a block diagram of an example analog-to-digital conversion (ADC) circuit including chop circuits and track-and-hold circuits, according to some embodiments.

Described herein are techniques that improve efficiency of analog-to-digital conversion (ADC) circuits by reducing idling time, during which the ADC circuit is not converting an analog signal to a digital representation, which reduces associated power consumption from keeping the ADC circuit running during idling time. In some embodiments, chop circuits may be used in combination with a plurality of track-and-hold (T/H) circuits to acquire one polarity of an input signal and convert another polarity of the input signal during a same sampling period. For example, a chop circuit may be configured to alternate between generating a first polarity of the input signal (e.g., as received) and a second polarity of the input signal (e.g., inverted with respect to as received). A first T/H circuit may be configured to acquire one polarity of the input signal from the chop circuit while a second T/H circuit provides another polarity of the input signal, previously acquired from the chop circuit, to an ADC for conversion.

The inventors have recognized and appreciated that there is often a tradeoff between sample rate, conversion accuracy, and power consumption in an ADC circuit, making it challenging to achieve a high sample rate and high accuracy while consuming a low amount of power. For instance, the accuracy of an ADC digitized output of an input analog signal may depend on noise (e.g., DC offset noise) introduced into the system. One technique that may be used to mitigate the impact of noise from a signal conditioning circuit is chopping the input signal into different polarities over time prior to digitization, and then chopping the digitized output to reorient the different polarities. It is recognized that chopping may periodically reset the noise level within the ADC circuit to achieve less overall noise than without chopping. For instance, chopping may displace any DC voltage offset and/or flicker noise into a higher frequency than without chopping, thereby facilitating averaging such noise out from the signal chain. On the other hand, the time needed to acquire each flipped polarity of the input signal for conversion (e.g., by charging and discharging the capacitors) may result in time during which the ADC is idle, resulting in high power consumption and a longer overall conversion time than without chopping.

To overcome these drawbacks, the inventors have developed techniques that improve efficiency of ADC circuits by reducing ADC idling time and associated power consumption. According to an aspect of the present disclosure, chop circuits may be used in combination with a plurality of track-and-hold (T/H) circuits to acquire one polarity of an input signal and convert another polarity of the input signal during a same sampling period.

In some embodiments, an ADC circuit may include a first chop circuit configured to receive an input (e.g., analog) signal and generate a first polarity (e.g., positive polarity) of the input signal during a first sampling period and a second polarity (e.g., negative polarity) of the input signal during a second sampling period. For example, the first chop circuit may include cross-coupled switches controllable to provide an output signal that is inverted with respect to the input signal as applied across its input terminals (e.g., during the second sampling period), and further controllable to output the input signal as received without inversion (e.g., during the first sampling period). In some embodiments, the ADC circuit may further include a first T/H circuit configured to acquire the first polarity of the input signal from the first chop circuit during the first sampling period and acquire the second polarity of the input signal from the first chop circuit during the second sampling period, and a second T/H circuit configured to output the second polarity of the input signal from the first chop circuit during the first sampling period and output the first polarity of the input signal from the first chop circuit during the second sampling period. For example, the first T/H circuit may be configured to acquire one polarity of the input signal from the first chop circuit while the second T/H circuit outputs another (e.g., previously acquired) polarity of the input signal from the first chop circuit.

In some embodiments, the ADC circuit may further include an ADC configured to convert the second polarity of the input signal from the second T/H circuit to one or more first digital bits during the first sampling period and convert the first polarity of the input signal from the second T/H circuit to one or more second digital bits during the second sampling period. For example, the first T/H circuit may acquire one polarity of the input signal while the ADC converts another polarity of the input signal to the digital bit(s) and vice versa, such that the ADC is converting one polarity of the input signal while the other polarity is being acquired, reducing or eliminating idling time of the ADC in between acquiring polarities of the input signal, and thereby improving power efficiency and increasing conversion speed.

In some embodiments, the ADC circuit may further include a second chop circuit configured to produce a digital representation of the input signal over the first sampling period and the second sampling period using the one or more first digital bits and the one or more second digital bits. For example, more than one acquisition and conversion may be performed using a given polarity of the input signal by switching T/H circuits (e.g., from acquiring to converting) at a frequency higher than (e.g., twice or more) the frequency used for chopping, which may further reduce noise (e.g., DC offset noise) from the signal chain, resulting in increased accuracy of an ADC circuit. For instance, digital samples may be selected for de-chopping and averaging at the output of the ADC that cause noise (e.g., from a capacitive gain amplifier) to cancel out.

A further aspect of the present disclosure relate to further increasing accuracy of an ADC circuit by operating the T/H circuits and/or ADC at a higher frequency than used for chopping the input signal. For example, more than one acquisition and conversion may be performed using a given polarity of the input signal by switching T/H circuits (e.g., from acquiring to converting) at a frequency higher than (e.g., twice or more) the frequency used for chopping, which may further reduce noise (e.g., DC offset noise) in the T/H circuits, resulting in increased accuracy of an ADC circuit.

A further aspect of the present disclosure relates to transmitting a digital representation of an input signal, produced using techniques described above, over an isolation barrier and receiving, over the isolation barrier, a clock signal for controlling the chop circuits and/or T/H circuits.

A further aspect of the present disclosure relates to selectively (e.g., randomly) digitizing portions of multiple input signals using techniques described above.

FIG. 1A is a block diagram of an example ADC circuit 100 including chop circuits 110, 150 and T/H circuits 130, according to some embodiments. In some embodiments, ADC circuit 100 may be configured to output a digital representation of an input signal, as described further herein.

As shown in FIG. 1A, ADC circuit 100 includes a first chop circuit 110 configured to receive an input signal $V_{IN}$. In some embodiments, first chop circuit 110 may be configured to chop input signal $V_{IN}$ to produce a chopped input signal. For example, the chopped input signal may have a polarity that varies over time. For instance, first chop circuit 110 may be configured to receive input signal $V_{IN}$ and output input signal $V_{IN}$ at some times and output an inverted version of input signal $V_{IN}$ at other times. In some embodiments, first chop circuit 110 may include a pair of cross-coupled switches having a pair of inputs configured to receive input signal $V_{IN}$ and a pair of outputs that, in a first state of the cross-coupled switches, connect the pair of outputs to the pair of inputs in a first polarity and, in a second state of the cross-coupled switches, connect the pair of outputs to the pair of inputs in a second, opposite polarity.

As shown in FIG. 1A, ADC circuit 100 includes a plurality of T/H circuits 130 coupled to first chop circuit 110. In some embodiments, T/H circuits 130 may be configured to receive a chopped input signal from first chop circuit 110 and output a portion of the chopped input signal. For example, in FIG. 1A, each T/H circuit 130 is shown coupled between a T/H input control circuit 132 and a T/H output control circuit 134. For instance, T/H input control circuit 132 may be configured to control which T/H circuit(s) 130 receive a chopped input signal from first chop circuit 110. In some embodiments, the chopped input signal output from first chop circuit 110 may vary between polarities, such that a first portion of the chopped input signal output at a first time has a first polarity and a second portion of the chopped input signal output at a second time has a second polarity. In some embodiments, controlling which T/H circuit(s) 130 are coupled to first chop circuit 110 over a given time period may determine which T/H circuit(s) 130 sample and hold a portion of the chopped input signal corresponding to that time period. For example, multiple T/H circuits 130 or groups of T/H circuits 130 may receive respective portions of the chopped input signal over time. In some embodiments, T/H output control circuit 134 may be configured to control which T/H circuit(s) 130 are coupled to ADC 140. For example, controlling which T/H circuit(s) 130 are coupled to ADC 140 over a given time period may determine which portion of the chopped input signal is converted over that time period. In the illustrated embodiment, each of T/H circuits 130 is coupled between first chop circuit 110 and ADC 140, such as with each being configured to be selected from among T/H circuits 130 to receive and/or provide a portion of the chopped input signal.

In some embodiments, each T/H circuit 130 may include a capacitor configured to track and hold a voltage of a signal received at the capacitor. In some embodiments, T/H input control circuit 132 may include a multiplexer and/or T/H output control circuit 134 may include a demultiplexer. For example, the multiplexer may be configured to receive a chopped input signal from first chop circuit 110 and controllable to select a T/H circuit 130 or group of T/H circuits 130 to which to provide the chopped input signal. Similarly, the demultiplexer may be configured to provide a portion of the chopped input signal to ADC 140 and to select a T/H circuit 130 or a group of T/H circuits 130 from which to provide the portion of the chopped input signal.

As shown in FIG. 1A, ADC circuit 100 includes an ADC 140 coupled to T/H circuits 130. In some embodiments, ADC 140 may be configured to receive a portion of a chopped input signal from T/H circuits 130 and output a digital representation of the portion of the chopped input signal, such as in one or more digital bits. For example, ADC 140 may include a delta-sigma modulated ADC, such as a single-bit delta-sigma modulated ADC, or a successive approximation register (SAR) ADC such as multi-bit SAR ADC.

As shown in FIG. 1A, ADC circuit 100 includes a second chop circuit 150 coupled to ADC 140 and configured to output a digital representation $V_{DIG}$. In some embodiments, digital representation $V_{DIG}$ may be of input signal $V_{IN}$. For example, digital representation $V_{DIG}$ may represent in one or more digital bits a voltage or current level of input signal $V_{IN}$. In some embodiments, second chop circuit 150 may include a digital demodulator configured to invert the polarity of a bit or stream of bits from ADC 140 at some times and to pass the bit or stream of bits with polarity intact at other times. For example, second chop circuit 150 may be implemented as a digital signal processing equivalent to the analog implementation of first chop circuit 110 described above.

Figure 1B:
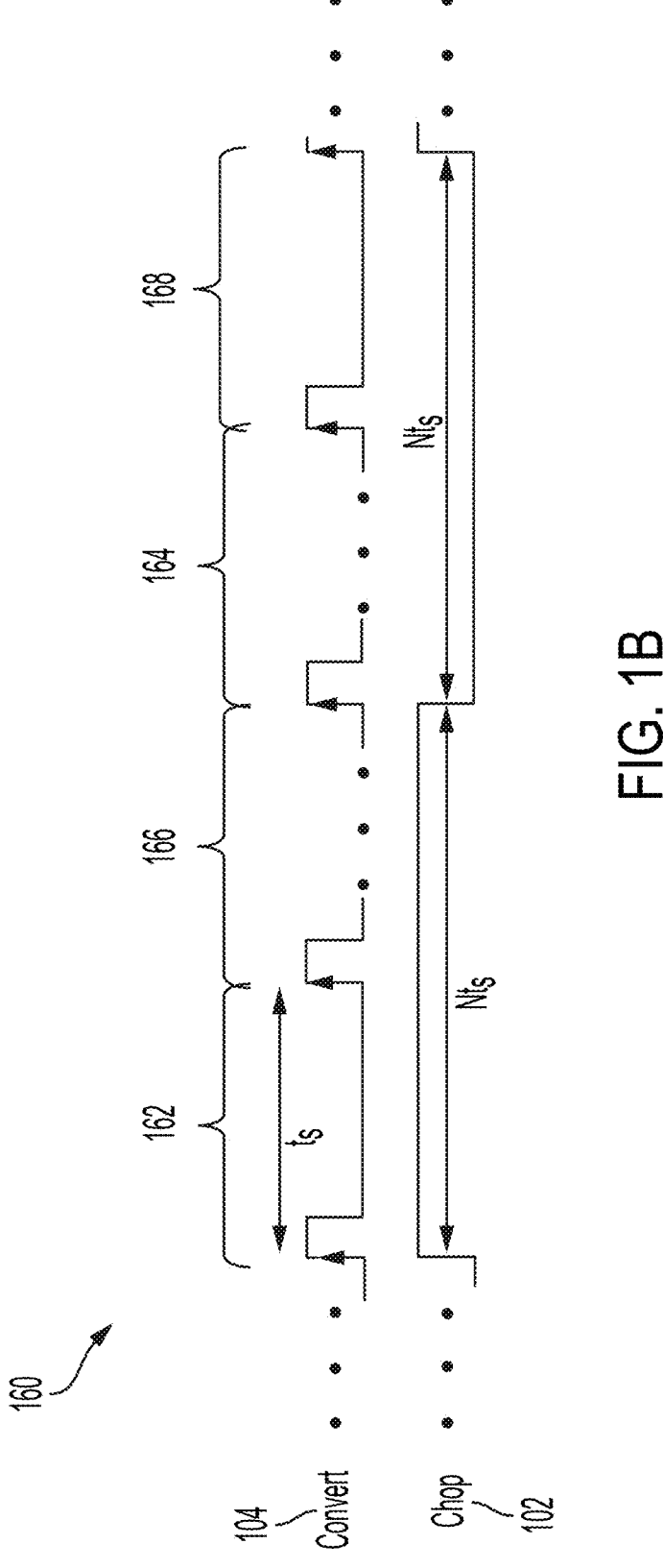
FIG. 1B is a timing diagram of example signals that may be used to operate the ADC circuit of FIG. 1A, according to some embodiments.

FIG. 1B is a timing diagram 160 of example chop signal 102 and conversion timing signal 104 that may be used to operate ADC circuit 100, according to some embodiments.

As shown in FIG. 1A, first chop circuit 110 and second chop circuit 150 may be configured to receive chop signal 102 and ADC 140 may be configured to receive conversion timing signal 104.

In some embodiments, first chop circuit 110 may be configured to generate a first polarity of input signal $V_{IN}$ during a first sampling period 162 and a second polarity of input signal $V_{IN}$ during a second sampling period 164. For example, as shown in FIG. 1B, during first sampling period 162, chop signal 102 is in a high state, which may control first chop circuit 110 to output the first polarity. For instance, where first chop circuit 110 includes a pair of cross-coupled switches, chop signal 102 may control the pair of cross-coupled switches to a first state (e.g., inverting) during first sampling period 162. Similarly, as shown in FIG. 1B, during second sampling period 164, chop signal 102 is in a low state, which may control first chop circuit 110 to output the second polarity. For instance, where first chop circuit 110 includes a pair of cross-coupled switches, chop signal 102 may control the pair of cross-coupled switches to a second state (e.g., non-inverting) during second sampling period 164.

In some embodiments, ADC 140 may be configured to convert the second polarity of input signal $V_{IN}$ during first sampling period 162 and convert the first polarity of input signal $V_{IN}$ during second sampling period 164. For example, as shown in FIG. 1B, during each of first sampling period 162 and second sampling period 164, conversion timing signal 104 rises and falls once. For instance, at the rising or falling edge of conversion timing signal 104, ADC 140 may begin converting a polarity of input signal $V_{IN}$ received from a T/H circuit 130. For instance, during first sampling period 164, a T/H circuit 130 (e.g., T/H$_1$) may hold a different polarity of input signal $V_{IN}$ for conversion by ADC 140 than during second sampling period 164.

In some embodiments, a first T/H circuit 130 (e.g., T/H$_1$) may be configured to acquire a first polarity of input signal $V_{IN}$ from first chop circuit 110 during first sampling period 162 and acquire a second polarity of input signal $V_{IN}$ from first chop circuit 110 during second sampling period 164. For example, the first T/H circuit 130 may begin acquiring the first polarity of input signal $V_{IN}$ from first chop circuit 110 during first sampling period 162 while ADC 140 converts the second polarity of input signal $V_{IN}$ from a second T/H circuit 130 (e.g., T/H$_2$). Similarly, the first T/H circuit 130 may begin acquiring the second polarity of input signal $V_{IN}$ from first chop circuit 110 during second sampling period 164 while ADC 140 converts the first polarity of input signal $V_{IN}$ from the second T/H circuit 130.

In the illustrated embodiment, chop signal 102 remains in a high state following first sampling period 162. For example, as illustrated, conversion timing signal 104 sets the sampling period duration of $t_s$ and chop signal 102 has a period of $Nt_s$. For instance, N may be an integer greater than 1 such that multiple rising and falling edges of conversion timing signal 104 occur within a period of chop signal 102.

Thus, as illustrated, a third sampling period 166 occurs between first sampling period 162 and second sampling period 164, and a fourth sampling period 168 immediately follows second sampling period 164.

In some embodiments, during third sampling period 166, the second T/H circuit 130 may be configured to acquire the first polarity of input signal $V_{IN}$ from first chop circuit 110 and the first T/H circuit 130 may be configured to output the second polarity of input signal $V_{IN}$ to ADC 140. Similarly, in some embodiments, during fourth sampling period 168, the second T/H circuit 130 may be configured to acquire the second polarity of input signal $V_{IN}$ from first chop circuit 110 and the first T/H circuit 130 may be configured to output the first polarity of input signal $V_{IN}$ to ADC 140.

Figure 3A:
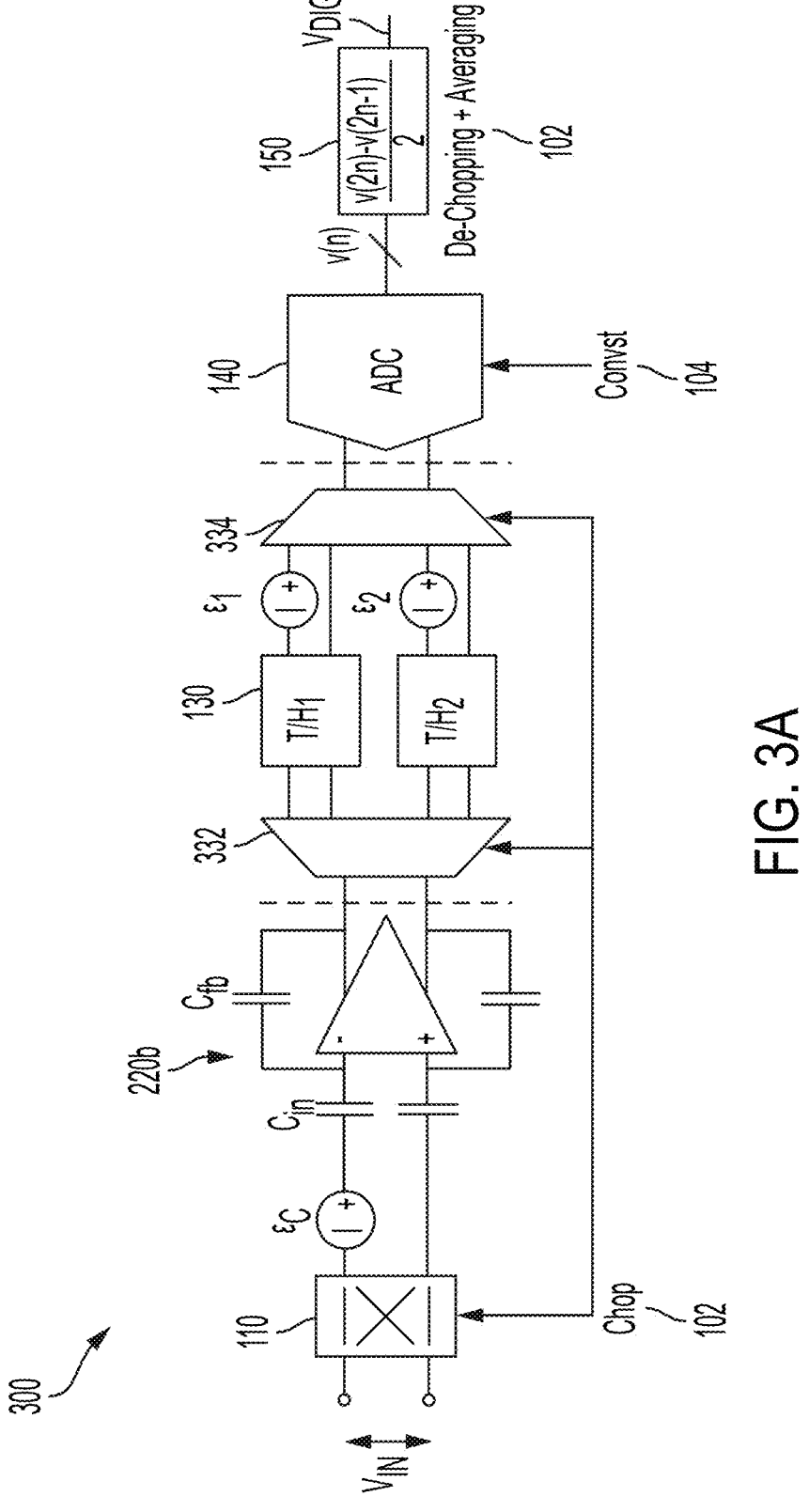
FIG. 3A is a circuit diagram of an example ADC circuit including chop circuits, track-and-hold circuits, and a capacitive gain amplifier of FIG. 2C, according to some embodiments.
Figure 3B:
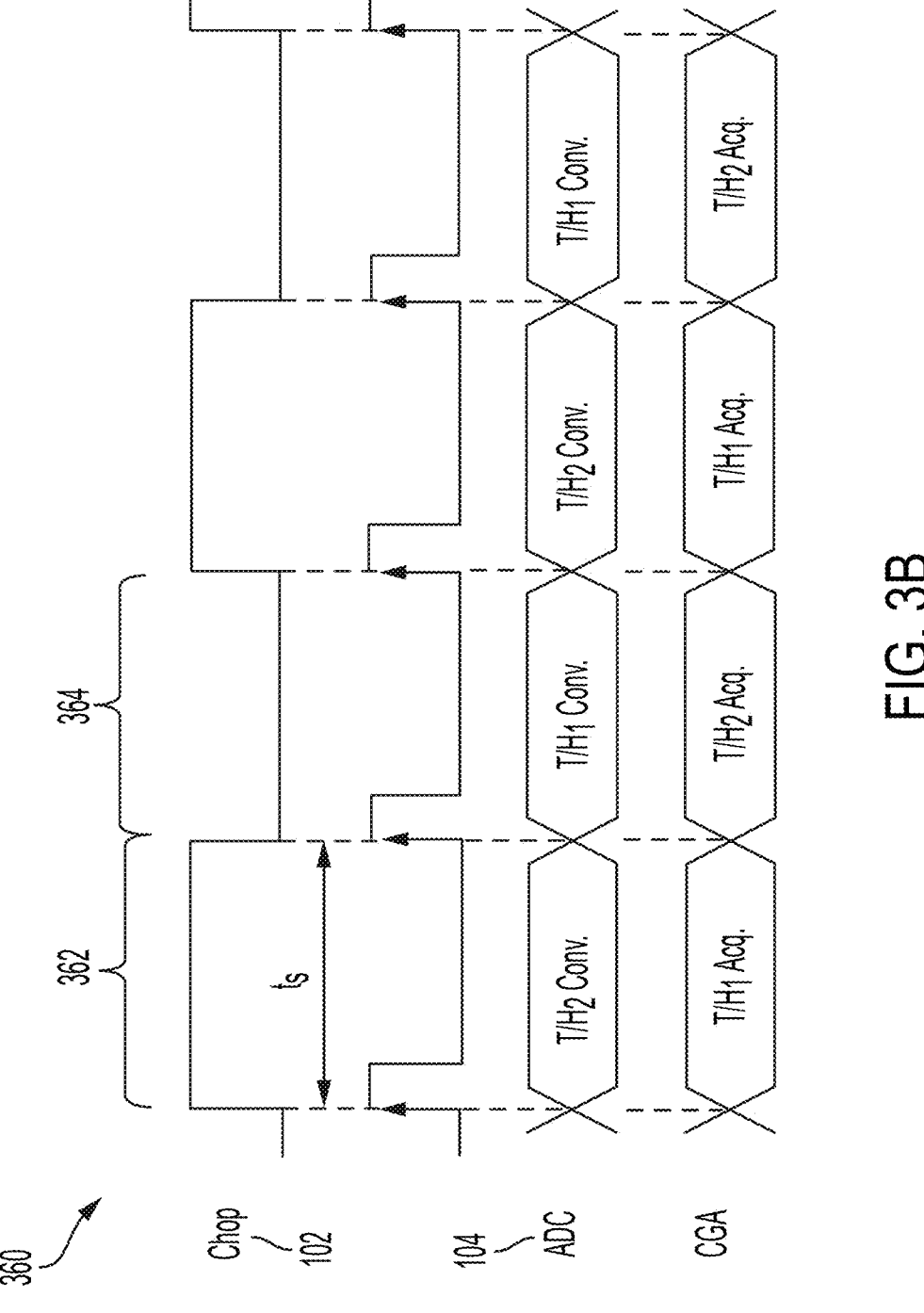
FIG. 3B is a timing diagram of example signals that may be used to operate the ADC circuit of FIG. 3A, according to some embodiments.

In other embodiments, such as illustrated in FIG. 3B, a chop signal may have a same period as a conversion timing signal, such that third sampling period 166 and fourth sampling period 168 may be omitted.

Figure 2A:
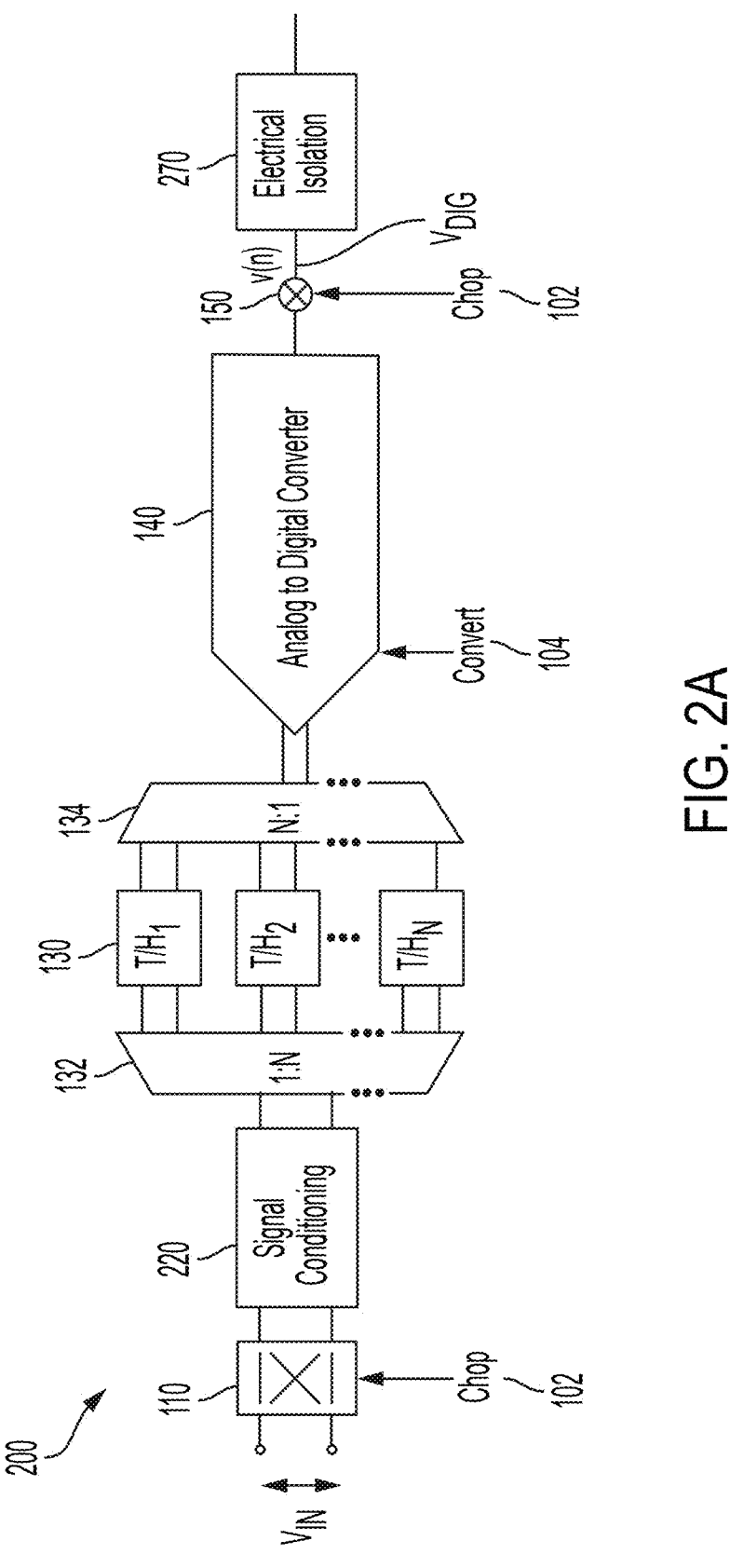
FIG. 2A is a block diagram of an example ADC circuit including chop circuits and track-and-hold circuits and further including a signal conditioning circuit and an isolator, according to some embodiments.

FIG. 2A is a block diagram of an example ADC circuit 200 including chop circuits 110, 150 and T/H circuits 130 and further including a signal conditioning circuit 220 and an isolator 270, according to some embodiments.

In some embodiments, ADC circuit 200 may be configured as described herein for ADC circuit 100 including in connection with FIGS. 1A-1B. For example, in FIG. 2A, ADC circuit 200 is shown including first chop circuit 110, T/H circuits 130, T/H input control circuit 132, T/H output control circuit 134, ADC 140, and second chop circuit 150. As shown in FIG. 2A, ADC circuit 200 further includes a signal conditioning circuit 220 coupled between first chop circuit 110 and T/H circuits 130. In some embodiments, signal conditioning circuit 220 may be configured to add power to the chopped input signal provided by first chop circuit 110 prior to providing the chopped input signal to T/H circuits 130. For instance, amplifying the chopped input signal may increase its signal-to-noise ratio and/or may reduce the time needed to charge capacitors of T/H circuits 130 due to providing more power than without amplification.

As shown in FIG. 2A, ADC circuit 200 further includes an isolator 270. In some embodiments, isolator 270 may be a galvanic isolator, such as may be used to maintain separation between different voltage domains, such as a very high voltage (e.g., kV) domain and a low voltage domain (e.g., V). For example, isolator 270 may be a transformer-based isolator having a pair of coils separated by electrically insulative material, though other types of isolators may be used.

While FIG. 2A shows isolator 270 in connection with ADC circuit 200, it should be appreciated that any ADC circuit described herein may be configured for use with an isolator, and further that ADC circuit 200 may be used without isolator 270.

Figure 2C:
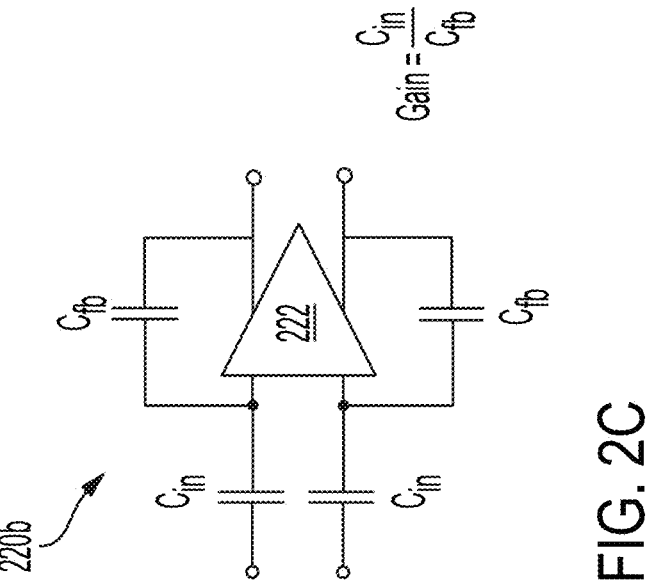
FIG. 2C is a circuit diagram of an example capacitive gain amplifier that may be included in the signal conditioning circuit of FIG. 2A, according to some embodiments.
Figure 2B:
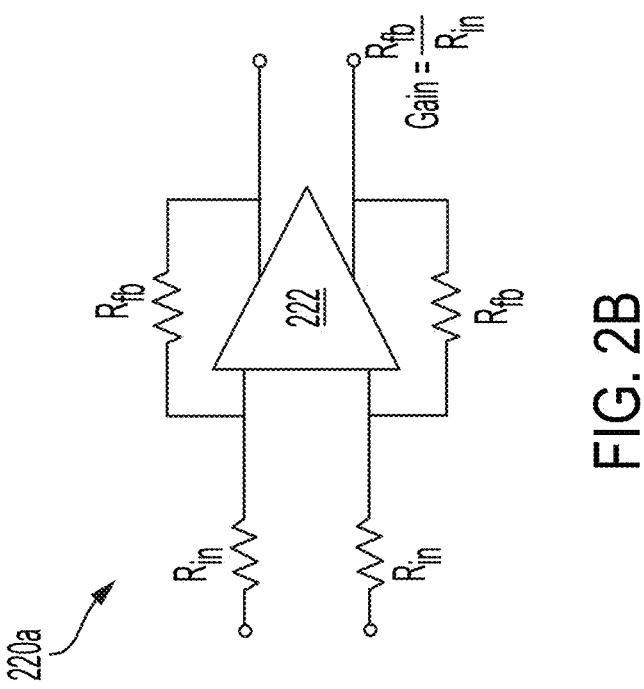
FIG. 2B is a circuit diagram of an example resistive gain amplifier that may be included in the signal conditioning circuit of FIG. 2A, according to some embodiments.

FIG. 2B is a circuit diagram of an example resistive gain amplifier 220a that may be included in signal conditioning circuit 220, according to some embodiments. As shown in FIG. 2B, resistive gain amplifier 220a includes an amplifier 222, input resistors $R_{IN}$, and feedback resistors $R_{FB}$. In some embodiments, the gain of resistive gain amplifier 220a may be the resistance of feedback resistors $R_{FB}$ divided by the resistance of input resistors $R_{IN}$.

FIG. 2C is a circuit diagram of an example capacitive gain amplifier 220b that may be included in signal conditioning circuit 220, according to some embodiments. As shown in FIG. 2C, capacitive gain amplifier 220b includes amplifier 222, input capacitors $C_{IN}$, and feedback capacitors $C_{FB}$. In some embodiments, the gain of capacitive gain amplifier

220b may be the capacitance of input capacitors Cm divided by the capacitance of feedback capacitors $C_{FB}$.

While resistive and capacitive gain amplifiers are provided as separate examples in FIGS. 2B and 2C, it should be appreciated that a signal conditioning circuit may alternatively or additionally include combinations of resistors and capacitors.

FIG. 3A is a circuit diagram of an example ADC circuit 300 including chop circuits 110, 150, T/H circuits 130, and capacitive gain amplifier 220b, according to some embodiments.

In some embodiments, ADC circuit 300 may be configured as described herein for ADC circuit 100 including in connection with FIGS. 1A-1B. For example, in FIG. 3A, ADC circuit 300 is shown including first chop circuit 110, T/H circuits 130, ADC 140, and second chop circuit 150. As shown in FIG. 3A, ADC circuit 300 further includes capacitive gain amplifier 220b coupled between first chop circuit 110 and T/H circuits 130.

Also shown in FIG. 3A, ADC circuit 300 includes a T/H multiplexer 332, which may be configured as described herein for T/H input control circuit 132 including in connection with FIGS. 1A-1B, and a T/H demultiplexer 334, which may be configured as described herein for T/H input control circuit 134 including in connection with FIGS. 1A-1B. For example, in FIG. 3A, T/H multiplexer 332 is shown configured to receive a chop signal 302, which may control T/H multiplexer 332 to switch from providing a chopped input signal from first chop circuit 110 to a first T/H circuit 130 (e.g., $T/H_1$) to providing the chopped input signal to a second T/H circuit 130 (e.g., $T/H_2$) or vice versa. Similarly, in FIG. 3A, T/H demultiplexer 334 is shown configured to receive chop signal 102, which may control T/H demultiplexer 334 to switch from providing a portion of a chopped input signal from a first T/H circuit 130 (e.g., a positive polarity portion of the input signal held by $T/H_1$) to ADC 140 to providing a portion of a chopped input signal from a second T/H circuit 130 (e.g., a negative polarity portion of the input held by $T/H_2$) to ADC 140, or vice versa.

In some embodiments, applying a chopped input signal to capacitive gain amplifier 220b may cause capacitive gain amplifier 220b to output the input signal with different polarity at different times, which may facilitate averaging out DC offset noise generated by capacitive gain amplifier 220b. As shown in FIG. 3A, DC offset noise in capacitive gain amplifier 220b may be modeled as a voltage source with capacitive noise value Fc.

Similarly, in some embodiments, applying a chopped input signal to a T/H circuit 130 may cause that T/H circuit 130 to carry one polarity of the input signal, which may separate DC offset noise in different T/H circuits 130 and cause the noise to have different polarities. As shown in FIG. 3A, DC offset noise in a first T/H circuit 130 ($T/H_1$) may be modeled as a voltage source with first T/H noise value $\varepsilon_1$, and DC offset noise in a second T/H circuit 130 ($T/H_2$) may be modeled as a voltage source with second T/H noise value $\varepsilon_2$.

FIG. 3B is a timing diagram 360 of example chop signal 302 and conversion timing signal 304 that may be used to operate ADC circuit 300, according to some embodiments.

In some embodiments, first chop circuit 110 may be configured to generate a first polarity of input signal $V_{IN}$ during a first sampling period 362 and a second polarity of input signal $V_{IN}$ during a second sampling period 364, such as described herein including in connection with FIG. 1B.

In some embodiments, T/H circuits 130 may be configured to acquire a first polarity of input signal $V_{IN}$ from first chop circuit 110 during first sampling period 362 and acquire a second polarity of input signal $V_{IN}$ from first chop circuit 110 during second sampling period 364. For example, as shown in FIG. 3B, during first sampling period 362, chop signal 302 is in the high state, which may cause T/H multiplexer 332 to select a first T/H circuit 130 (e.g., T/H$_1$) to acquire the first polarity of input signal $V_{IN}$. Similarly, as shown in FIG. 3B, during second sampling period 364, chop signal 302 is in the low state, which may cause T/H multiplexer 332 to select a second T/H circuit 130 (e.g., T/H$_2$) to acquire the second polarity of input signal $V_{IN}$.

In some embodiments, T/H circuits 130 may be further configured to output the second polarity of input signal $V_{IN}$ from first chop circuit 110 during first sampling period 362 and output the first polarity of input signal $V_{IN}$ from first chop circuit during second sampling period 364. For example, as shown in FIG. 3B, during first sampling period 362, chop signal 302 is in the high state, which may cause TH demultiplexer 334 to select the second T/H circuit 130 to output the second polarity of input signal $V_{IN}$ to ADC 140 for conversion. For instance, as shown in FIG. 3B, conversion timing signal 304 rises and falls during first sampling period 362, and at the rising or falling edge, ADC 140 may begin converting a portion of a chopped input signal from the second T/H circuit 130. Similarly, as shown in FIG. 3B, during second sampling period 364, chop signal 302 is in the low state, which may cause TH demultiplexer 334 to select the first T/H circuit 130 to output the first polarity of input signal $V_{IN}$ to ADC 140 for conversion. For instance, as shown in FIG. 3B, conversion timing signal 304 also rises and falls during second sampling period 364, and at the rising or falling edge, ADC 140 may begin converting a portion of a chopped input signal from the first T/H circuit 130.

In some embodiments, ADC 140 may be configured to convert the second polarity of input signal $V_{IN}$ from the second T/H circuit to one or more first digital bits during first sampling period 362 and convert the first polarity of input signal $V_{IN}$ from the first T/H circuit to one or more second digital bits during second sampling period 364. For example, the first digital bit(s) may provide a digital representation of the portion of the chopped input signal acquired in the sampling period prior to first sampling period 362, and the second digital bit(s) may provide a digital representation of the portion of the chopped input signal acquired in first sampling period 362. In some embodiments, second chop circuit 150 may be configured to produce digital representation $V_{DIG}$ of input signal $V_{IN}$ over first sampling period 362 and second sampling period 364 using the first digital bit(s) and the second digital bit(s) converted by ADC 140.

In the illustrated embodiment, the signal plus noise from capacitive gain amplifier 220b for each sampling period may be given by $A(V_{IN}+\varepsilon_C)$ (where A is the gain of capacitive gain amplifier 220b), whereas the signal plus noise output from ADC 140 may differ between first sampling period 362 and second sampling period 364. For instance, the signal plus noise output from ADC 140 for first sampling period 362 may be given by $A(V_{IN}+\varepsilon_C)+\varepsilon_2$, whereas the signal plus noise output from ADC 140 for second sampling period 364 may be given by $A(V_{IN}+\varepsilon_C)+\varepsilon_1$, which difference may result from ADC 140 converting a portion of the chopped output signal from the second T/H circuit 130 during first sampling period 362 and from the first T/H circuit 130 during second sampling period 364. In some embodiments, the signal plus noise content of the output digital representation of input signal $V_{IN}$ from second chop circuit 150 over first sampling period 362 and second sampling period 364 may be given by $$AV_{IN} + \frac{\varepsilon_1 - \varepsilon_2}{2},$$

such as due to the different polarities of the DC offset noise in capacitive gain amplifier 220b that may cancel out when averaged, and due to the offset error in T/H circuits having different polarities. For instance, averaging may be achieved implicitly where ADC 140 is implemented using a delta-sigma ADC.

In the illustrated embodiment, chop signal 302 has a period equal to sampling period $t_s$ of conversion timing signal 304, such as may correspond to the case of N=1 for FIG. 1B. In other embodiments (e.g., FIG. 4B), N may be greater than 1.

Figure 4A:
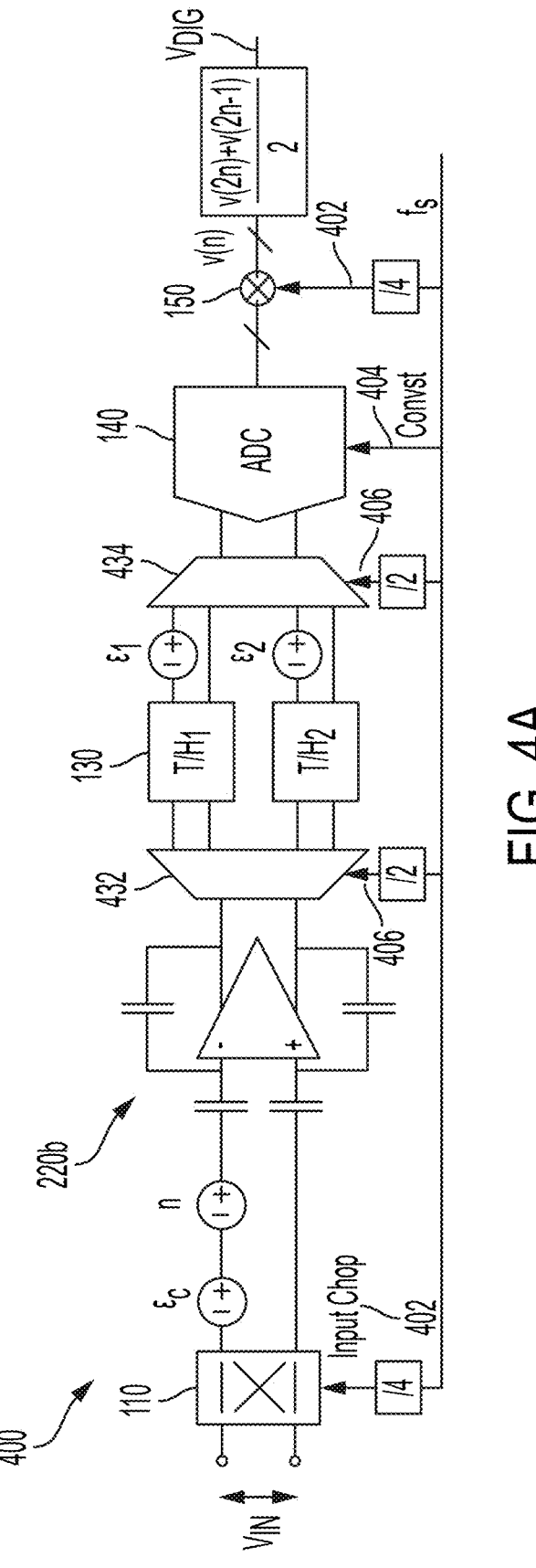
FIG. 4A is a circuit diagram of an example ADC circuit including chop circuits and track-and-hold circuits configured to receive chop signals and control signals having different frequencies, according to some embodiments.

FIG. 4A is a circuit diagram of an example ADC circuit 400 including chop circuits 110, 150 and T/H circuits 130 configured to receive chop signal 402 and control signal 406 having different respective frequencies, according to some embodiments.

In some embodiments, ADC circuit 400 may be configured as described herein for ADC circuit 300 including in connection with FIGS. 3A-3B. For example, in FIG. 4A, ADC circuit 400 is shown including first chop circuit 110, capacitive gain amplifier 220b, T/H circuits 130, ADC 140, and second chop circuit 150. As shown in FIG. 4A, ADC circuit 400 further includes T/H multiplexer 432, which may be configured as described herein for T/H multiplexer 332 including in connection with FIGS. 3A-3B, and T/H demultiplexer 434, which may be configured as described herein for T/H demultiplexer 334 including in connection with FIGS. 3A-3B.

As shown in FIG. 4A, first chop circuit 110 and second chop circuit 150 may be configured to receive chop signal 402 and T/H multiplexer 432 and T/H demultiplexer 434 may be configured to receive control signal 406. In some embodiments, conversion timing signal 404 may have a higher frequency than chop signal 402. For example, as illustrated in FIG. 4A, ADC 140 is configured to receive conversion timing signal 404 having a sampling frequency $f_s$ (e.g., corresponding to a sampling period of $t_s$), control signal 406 has a frequency of one-half sampling frequency $f_s$, and chop signal 402 has a frequency of one-quarter sampling frequency $f_s$. For instance, control signal 406 may be obtained by frequency dividing a clock signal having the sampling frequency $f_s$ by two, and chop signal 402 may be obtained by frequency dividing the clock signal by four.

Figure 4B:
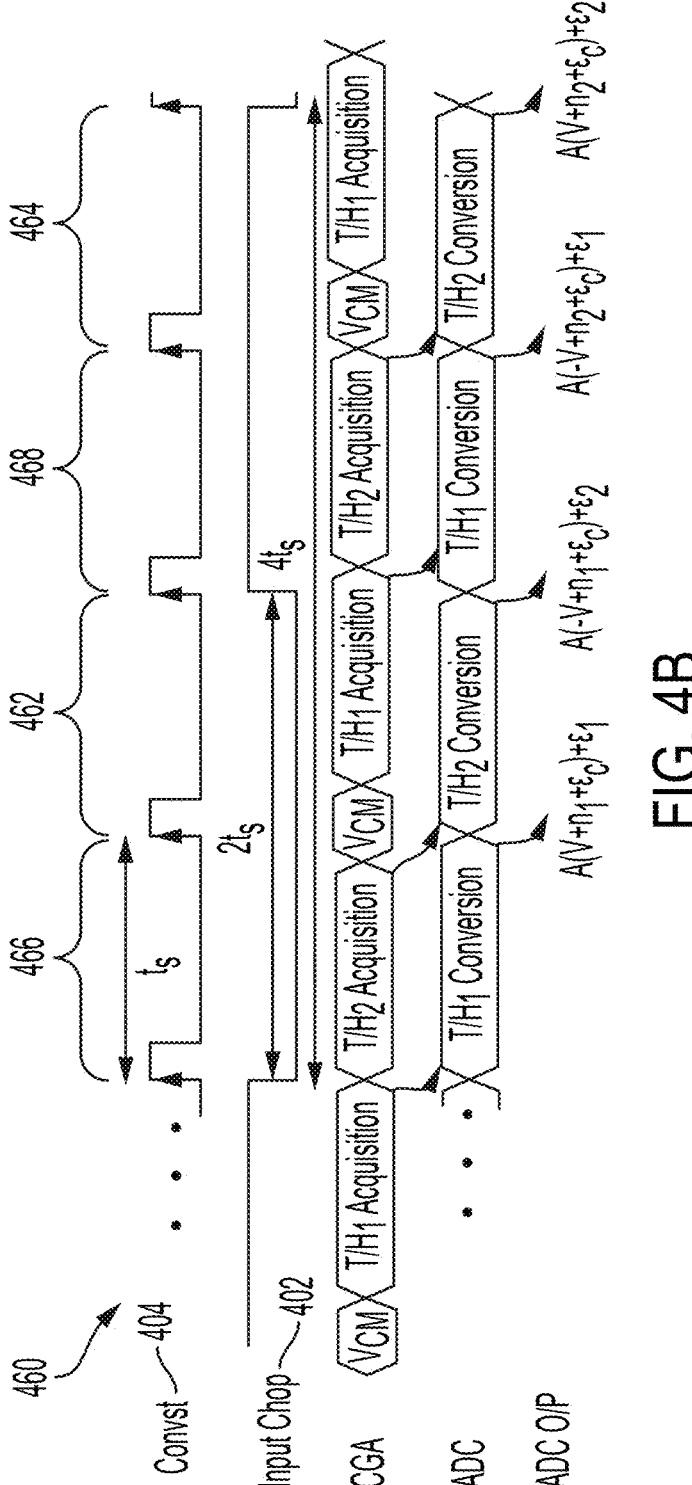
FIG. 4B is a timing diagram of example signals having different frequencies that may be used to operate the ADC circuit of FIG. 4A, according to some embodiments.

FIG. 4B is a timing diagram 460 of example chop signal 402 and conversion timing signal 404 having different frequencies that may be used to operate ADC circuit 400, according to some embodiments.

In some embodiments, first chop circuit 110 may be configured to generate a first polarity of input signal $V_{IN}$ during a first sampling period 462 and a second polarity of input signal $V_{IN}$ during a second sampling period 464, such as described herein including in connection with FIG. 1B.

In some embodiments, a first T/H circuit 130 (e.g., T/H$_1$) may be configured to acquire a first polarity of input signal $V_{IN}$ from first chop circuit 110 during first sampling period 462 and acquire a second polarity of input signal $V_{IN}$ from first chop circuit 110 during second sampling period 464. For example, as shown in FIG. 4B, during first sampling period 462, chop signal 402 is in the low state, whereas during second sampling period 464, chop signal 402 is in the high state. For instance, control signal 406 may cause T/H multiplexer 432 to alternate between selecting the first T/H circuit 130 and the second T/H circuit 130 each sampling period, such that the first T/H circuit 130 is selected to acquire the chopped input signal from first chop circuit 110 during each of first sampling period 462 and second sampling period 464.

In some embodiments, a second T/H circuit 130 (e.g., T/H$_2$) may be configured to output the second polarity of input signal V$_{IN}$ from first chop circuit 110 during first sampling period 462 and output the first polarity of input signal V$_{IN}$ from first chop circuit 110 during second sampling period 464. For example, control signal 406 may cause T/H demultiplexer 434 to alternate between selecting the first T/H circuit 130 and the second T/H circuit 130 each sampling period, such that the second T/H circuit 130 is selected to output to ADC during each of first sampling period 462 and second sampling period 464. For instance, the second T/H circuit 130 may have a polarity of input signal V$_{IN}$ acquired in a previous sampling period to output to ADC 140. In some embodiments, ADC 140 may be configured to convert the second polarity of input signal V$_{IN}$ from the second T/H circuit (to one or more first digital bits during first sampling period 462 and convert the first polarity of input signal V$_{IN}$ from the second T/H circuit to one or more second digital bits during second sampling period 464. In some embodiments, second chop circuit 150 may be configured to produce digital representation V$_{DIG}$ of input signal V$_{IN}$ over first sampling period 462 and second sampling period 464 using the first digital bit(s) and the second digital bit(s) converted by ADC 140.

In some embodiments, the second T/H circuit 130 may be configured to acquire the first polarity of input signal V$_{IN}$ from first chop circuit 110 during a third sampling period 466 and acquire the second polarity of input signal V$_{IN}$ from first chop circuit 110 during a fourth sampling period 468. For example, as shown in FIG. 4B, chop signal 402 is in the low state during third sampling period 466 and chop signal 402 is in the high state during fourth sampling period 468. For instance, control signal 406 may cause T/H multiplexer 432 to alternate to providing the chopped input signal to the second T/H circuit 130 during third sampling period 466 and fourth sampling period 468.

In some embodiments, the first T/H circuit 130 may be further configured to output the first polarity of input signal V$_{IN}$ from first chop circuit 110 during third sampling period 466 and output the second polarity of input signal V$_{IN}$ from first chop circuit 110 during fourth sampling period 468. For example, control signal 406 may cause T/H demultiplexer 434 to alternate to providing the portion of the chopped input signal from the first T/H circuit 130 to ADC 140 during third sampling period 466 and fourth sampling period 468.

In some embodiments, first chop circuit 110 and second chop circuit 150 may be configured to operate over a chop period that is longer than or equal to twice first sampling period 462 and second sampling period 464. For example, in FIGS. 4A-4B, conversion timing signal 404 has sampling frequency f$_s$ corresponding to sampling period t$_s$, and chop signal 402 has a chop period of 4t$_s$. For instance, in the illustrated embodiment, four periods of duration t$_s$ may occur within one chop period of chop signal 402. For instance, during a first pair of periods of duration t$_s$, chop signal 102 may control first chop circuit 110 to output the chopped input signal having a first polarity, and during a second pair of periods of duration t$_s$, chop signal 402 may control first chop circuit 110 to output the chopped input signal having a second polarity. In other embodiments, a chop period may be equal to twice sampling period t$_s$, such as shown in the example of FIGS. 3A-3B. According to various embodiments, a chop period may be equal to any integer multiple of sampling period t$_s$, such as 2, 3, 4, etc, for instance as described further below in connection with FIGS. 7A-7B.

In some embodiments, first T/H circuit 130 and second T/H circuit 130 may be configured to operate over a T/H period that is shorter than the chop period. For example, in FIGS. 4A-4B, control signal 406 has a period of 2t$_s$, which is half the chop period of chop signal 402 of 4t$_s$. For instance, in the illustrated embodiment, two periods of duration t$_s$ may occur within one period of control signal 406. For instance, during a first period of duration t$_s$, control signal 406 may control T/H multiplexer 432 to provide a chopped input signal from first chop circuit 110 to a first T/H circuit 130 (e.g., T/H$_1$) and control signal 406 may control T/H demultiplexer 434 to provide a portion of a chopped input signal from a second T/H circuit 130 (e.g., T/H$_2$) to ADC 140. During a second period of duration t$_s$, control signal 406 may control T/H multiplexer 432 to provide the chopped input signal to the second T/H circuit 130 (e.g., T/H$_2$) and control signal 406 may control T/H demultiplexer 334 provide a portion of a chopped input signal from the first T/H circuit 130 (e.g., T/H$_1$) to ADC 140. According to various embodiments, more than two T/H periods may occur within a chop period, such as depending on the number of T/H circuits 130 in use.

As shown in FIG. 4B, the noise content of the chopped input signal as converted by the ADC may be different between adjacent sampling periods. For example, in FIG. 4B, the signal plus noise output from ADC 140 for third sampling period 466 may be given by A(V$_{IN}$+n$_1$+ε$_C$)+ε$_1$ whereas the signal plus noise output from ADC 140 for first sampling period 462 may be given by A(V$_{IN}$+n$_2$+ε$_C$)+ε$_2$ (where n$_1$ and n$_2$ are noise voltages resulting from resetting the summing junction of capacitive gain amplifier 220b), which difference may result from ADC 140 converting a portion of the chopped output signal from the first T/H circuit 130 during third sampling period 466 and from the second T/H circuit 130 during first sampling period 462. In some embodiments, the signal plus noise content of the output digital representation of input signal V$_{IN}$ from second chop circuit 150 over third sampling period 466 and first sampling period 462 may be given by $$AV_{IN} + \frac{\varepsilon_1 - \varepsilon_2}{2},$$

such as due to the different polarities of the DC offset noise in capacitive gain amplifier 220b that may cancel out, and due to the offset error in T/H circuits having different polarities. In the illustrated example, switching between T/H circuits within a chop period may permit the DC offset noise in capacitive gain amplifier 220b to cancel out even where ADC 140 is implemented as an SAR ADC. For instance, samples from the digital representation may be selected for de-chopping such that after averaging, DC offset noise from capacitive gain amplifier 220b is substantially or entirely eliminated.

While the illustrated example of FIG. 4B shows the first polarity of input signal V$_{IN}$ as corresponding to chop signal 402 being in the high state and the second polarity as corresponding to chop signal 402 being in the low state, it should be appreciated that either polarity may correspond to either state of chop signal 402 in any embodiment.

Figure 5:
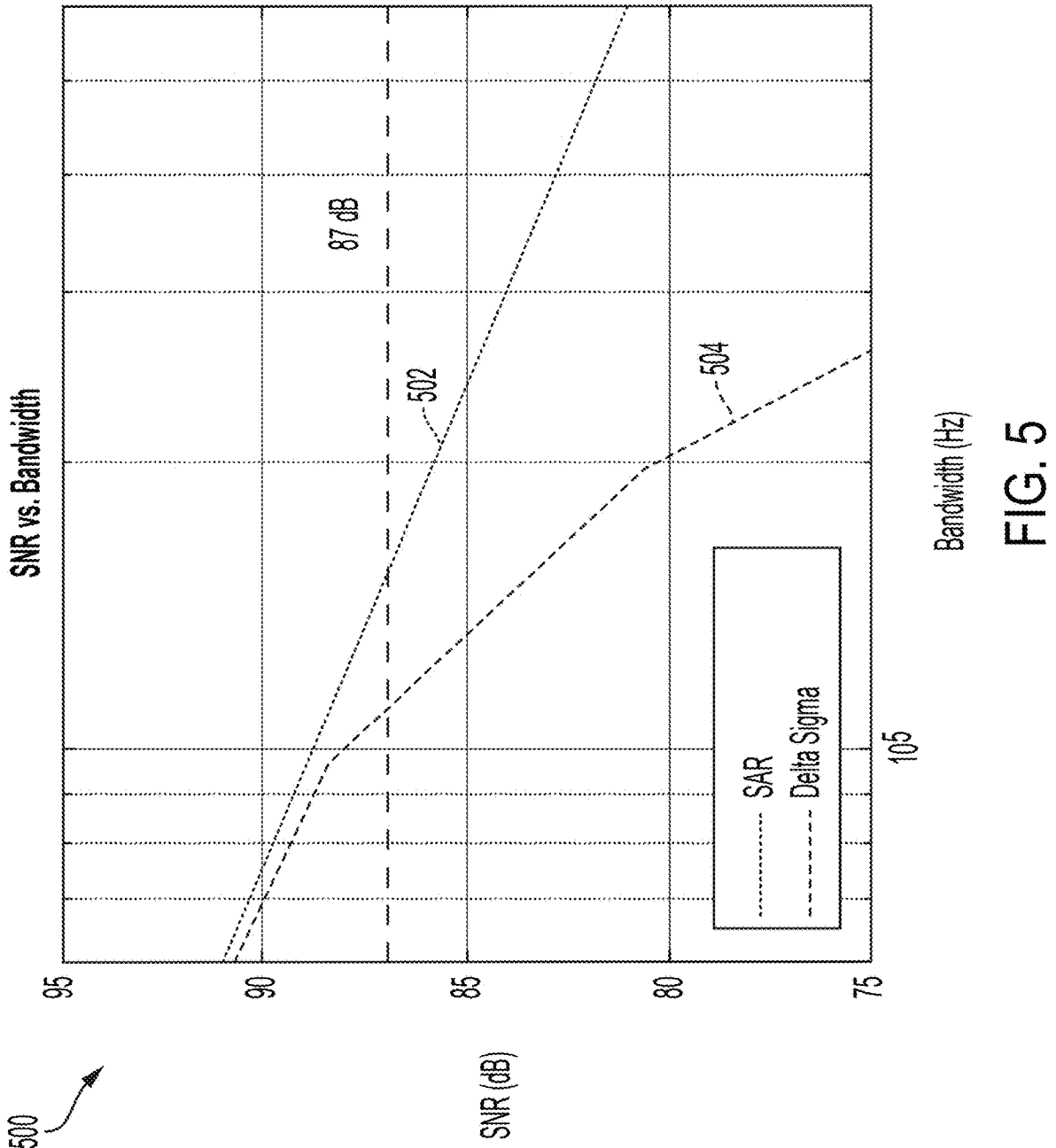
FIG. 5 is a graph of signal-to-noise ratio vs. bandwidth for a successive approximation register ADC and for a delta-sigma modulated ADC, according to some embodiments.

FIG. 5 is a graph 500 of signal-to-noise ratio (SNR) vs. bandwidth for an SAR ADC 502 and for a delta-sigma (ΔΣ) modulated ADC 504, according to some embodiments.

By way of example, the delta-sigma modulated ADC 504 may be a 1-bit delta-sigma ADC, whereas the SAR ADC 502 may be a 14-bit ADC, though it should be appreciated that any number of digital bit outputs may be used with techniques described herein.

As shown in FIG. 5, a benchmark of 87 dB SNR is labeled and the SNRs of the SAR ADC 502 and of the delta-sigma modulated ADC 504 are plotted over their bandwidths. In FIG. 5, the SAR ADC 502 achieves at least the benchmark SNR over a wider bandwidth than the delta-sigma modulated ADC 504, which may be due to dominating noise from the quantizer of the delta-sigma modulated ADC 504 at the higher end of the operating band. As such, in some embodiments where low noise is desired over a large bandwidth, an SAR ADC 502 (or other multi-bit ADC) may be preferable. And, as described above, techniques described herein may be implemented to achieve low noise in delta-sigma modulated ADCs and SAR or other multi-bit ADCs to permit flexibility in selecting an ADC to suit the particular application.

Figures 6A, 6B:
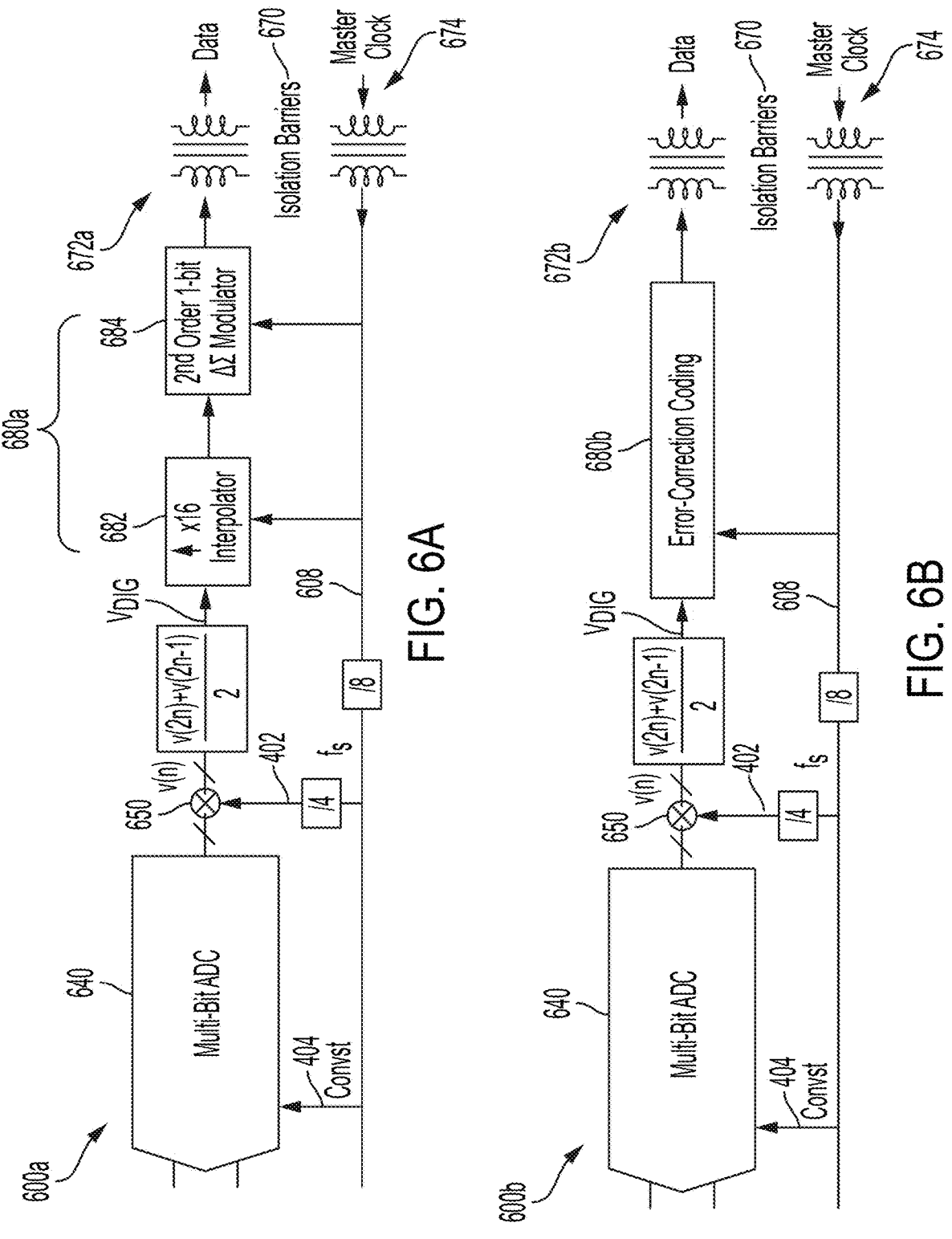
FIG. 6A is a circuit diagram of a portion of an example ADC circuit having interpolation and modulation circuitry configured to transmit a digital representation from an ADC over an isolation barrier, according to some embodiments.
FIG. 6B is a circuit diagram of a portion of an example ADC circuit having error-correction circuitry configured to transmit a digital representation from an ADC over an isolation barrier, according to some embodiments.

FIG. 6A is a circuit diagram of a portion 600a of an example ADC circuit having interpolation and modulation circuitry configured to transmit a digital representation from an ADC over an isolation barrier, according to some embodiments.

In some embodiments, ADC circuit portion 600a may be configured as described herein for ADC circuit 400. For example, in FIG. 6A, ADC circuit portion 600a is shown including a multi-bit ADC 640, which may be configured as described herein for ADC 140 including in connection with FIGS. 1A-1B. For instance, multi-bit ADC 640 may be implemented as an SAR ADC. Also shown in FIG. 6A, ADC circuit portion 600a includes multi-bit chop circuit 650, which may be configured as described herein for second chop circuit 150. For instance, multi-bit chop circuit 650 may be configured to receive and process multiple digital bits output from multi-bit ADC 640.

In some embodiments, ADC circuit portion 600a may be configured as described herein for ADC circuit 200. For example, in FIG. 6A, ADC circuit portion 600a is shown proximate to an isolation barrier 670, across which ADC circuit portion 600a may be configured to exchange signals as described further below.

As shown in FIG. 6A, ADC circuit portion 600a includes transmission circuitry 680a coupled to multi-bit chop circuit 650. In some embodiments, transmission circuitry 680a may be configured to transmit digital representation $V_{DIG}$ of the input signal (e.g., $V_{IN}$) from multi-bit chop circuit 650 over isolation barrier 670, such as by transmitting a modulated version of digital representation $V_{DIG}$ over isolation barrier 670. For example, in FIG. 6A, transmission circuitry 680a includes interpolator 682 and delta-sigma modulator 684, which may be configured to up-convert and modulate digital representation $V_{DIG}$ for transmission via a data isolator 672a across isolation barrier 670. For instance, using interpolator 682 and delta-sigma modulator 684 as shown in FIG. 6A may permit the same interaction between multi-bit ADC 640 and multi-bit chop circuit 650 with data isolator 672a as if a single bit (e.g., delta-sigma modulated) ADC were used, which may simplify the selection of data isolator 672a.

As shown in FIG. 6A, ADC circuit portion 600a may be configured to receive, over isolation barrier 670, a clock signal 608. For example, in FIG. 6A, clock signal 608 is received over isolation barrier 670 via a clock isolator 674.

In some embodiments, ADC circuit portion 600a may be configured to operate multi-bit chop circuit 650 and ADC 640 based on clock signal 608. For example, clock signal 608 may be used to generate chop signal 402 and conversion timing signal 404. For instance, in FIG. 6A, conversion timing signal 404 is generated by dividing the sampling frequency $f_s$ by 8, and chop signal 402 is generated by dividing the sampling frequency $f_s$ of clock signal 608 by 8 and then again by 4. In some embodiments, the ADC that includes ADC circuit portion 600a may be configured to operate a first chop circuit (e.g., 110, not shown) based on clock signal 608, such as by providing chop signal 402 to the first chop circuit. In some embodiments, a control signal for controlling selection of T/H circuits (e.g., 406) may be further generated using clock signal 608, such as by dividing clock signal 608 by 8 and then again by 2, which may result in the example shown in FIG. 4B above.

FIG. 6B is a circuit diagram of a portion 600b of an example ADC circuit having error-correction circuitry configured to transmit a digital representation from an ADC over an isolation barrier, according to some embodiments.

In some embodiments, ADC circuit portion 600b may be configured as described herein for ADC circuit portion 600a. For example, in FIG. 6B, ADC circuit portion 600b is shown including multi-bit ADC 640 and multi-bit chop circuit 650, and further including transmission circuitry 680b, which may be configured as described herein for transmission circuitry 680a. In FIG. 6B, transmission circuitry 680b is shown including error-correction coding circuitry, which may be configured to modulate multiple digital bits of digital representation $V_{DIG}$ from multi-bit chop circuit 650 for transmission via a data isolator 672b. For example, error-correction modulation may be implemented using one or more parity bits and/or other error coding techniques. In some embodiments, data isolator 672b may differ from data isolator 672a in that multiple bits may be transmitted rather than a single bit.

In some embodiments, clock signal 608 may be used for controlling timing of a transition between sampling periods (e.g., from first sampling period 362 to second sampling period 364, from third sampling period 466 to first sampling period 462, etc.). For example, as shown in FIGS. 6A and 6B, clock signal 608 may be used to generate conversion timing signal 404, which may set the duration $t_s$ of sampling periods, which may occur as described herein in connection with FIGS. 1B, 3B, and/or 4B.

Figure 7A:
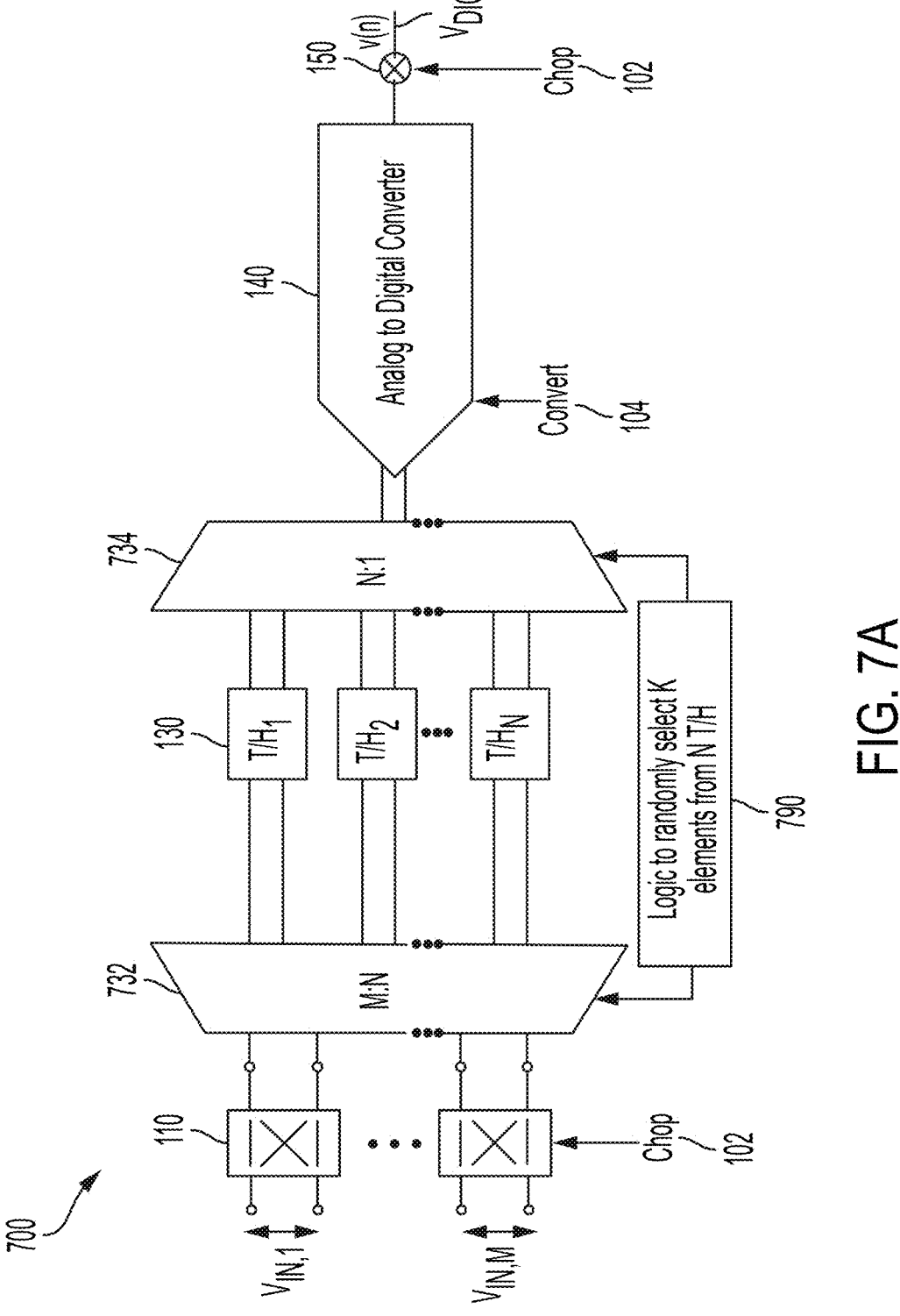
FIG. 7A is a block diagram of an example ADC circuit configured to output digital representations of multiple input signals, according to some embodiments.

FIG. 7A is a block diagram of an example ADC circuit 700 configured to output digital representations of multiple input signals, according to some embodiments.

In some embodiments, ADC circuit 700 may be configured as described herein for ADC circuit 100 including in connection with FIGS. 1A-1B. For example, in FIG. 7A, ADC circuit 700 is shown including first chop circuit 110, T/H circuits 130, ADC 140, and second chop circuit 150. Also shown in FIG. 7A, ADC circuit 200 includes a plurality of first chop circuits 110, T/H input control circuit 732, T/H output control circuit 734, and random selection circuitry 790.

In some embodiments, ADC circuit 700 may be configured to selectively output a digital representation of an input signal among multiple input signals. For example, as shown in FIG. 7A, ADC circuit 700 may have a first chop circuit 110 for each input signal $V_{IN,1}$ to $V_{IN,M}$ and second chop circuit 150 may be configured to output digital representation $V_{DIG}$ as a digital representation of one of input signals $V_{IN,1}$ to $V_{IN,M}$ at any given time. For instance, T/H input control circuit 732 may be configured to select among T/H circuit(s) 130 to acquire a chopped input signal (e.g., from any one of input signals $V_{IN,1}$ to $V_{IN,M}$) and T/H output control circuit 734 may be configured to select among T/H circuit(s) 130 to be coupled to ADC 140. In the illustrated embodiment, T/H input control circuit 732 may be configured as an M:N multiplexer where M is the number of input signals $V_{IN,1}$ to $V_{IN,M}$ and N is the number of T/H circuits 130, and T/H output control circuit 734 may be configured as an N:1 demultiplexer.

In some embodiments, ADC circuit 700 may be configured to randomly select T/H circuits 130 to receive and/or provide a chopped input signal. For example, in FIG. 7A, T/H input control circuitry 732 and T/H output control circuitry 734 are shown configured to receive a control signal from random selection circuitry 790, which may be a randomly generated signal. For instance, a randomly generated signal may cause selection of a subset of T/H circuits 130 to receive and/or provide a chopped input signal. In the illustrated embodiment, random selection circuitry 790 may be configured to select a subset of K T/H circuit(s) 130.

Figure 7B:
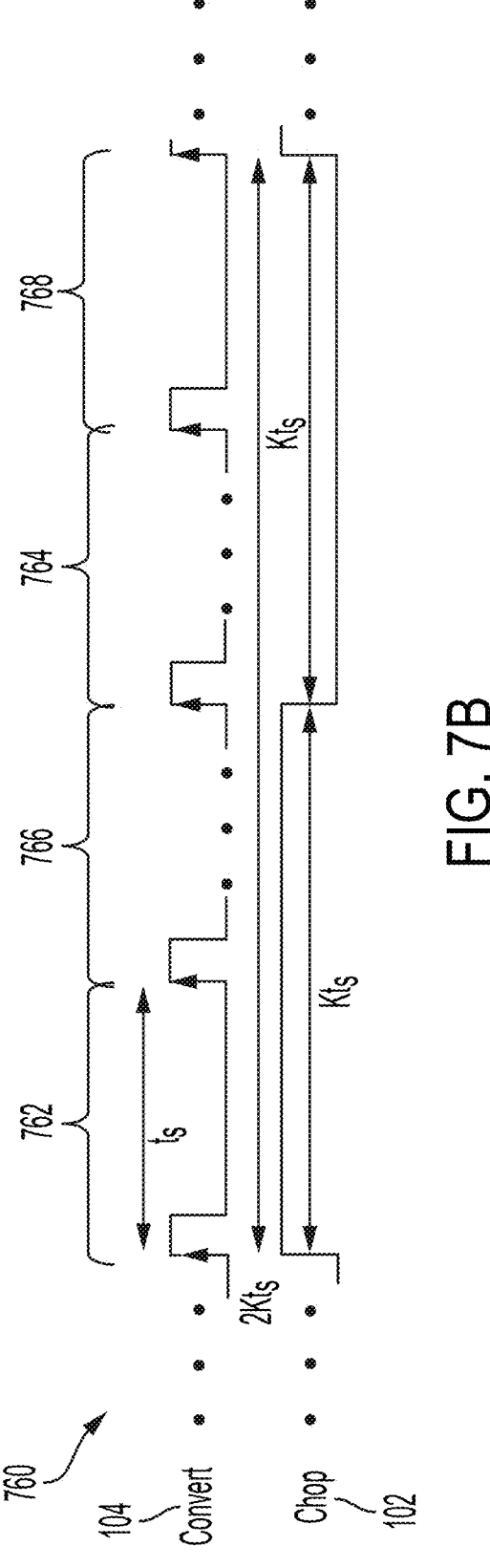
FIG. 7B is a timing diagram of example signals that may be used to operate the ADC circuit of FIG. 7A, according to some embodiments.

FIG. 7B is a timing diagram 760 of example signals that may be used to operate the ADC circuit of FIG. 7A, according to some embodiments.

In some embodiments, each first chop circuit 110 may be configured to generate a first polarity of a respective input signal $V_{IN,1}$ to $V_{IN,M}$ during a first sampling period 762 and a second polarity of the respective input signal $V_{IN,1}$ to $V_{IN,M}$ during a second sampling period 764, such as described herein including in connection with FIG. 1B. For example, where K=2, two T/H circuits 130 may be selected, with one T/H circuit 130 receiving a chopped input signal from a first input signal (e.g., $V_{IN,1}$) during first sampling period 762 while another T/H circuit 130 provides a chopped input signal acquired during the preceding sampling period (e.g., from a second input signal, e.g., $V_{IN,M}$) to ADC 140. For instance, where K=2, the chop period may be equal to $2 \times 2 \times t_s$, which is $4t_s$, and chop signal 702 may be chop signal 402.

According to various embodiments, K may be any integer such as 2, 3, 4, etc. For example, where K=4, four T/H circuits 130 may be selected, with a first T/H circuit 130 receiving a first portion (e.g., polarity) of a chopped input signal (e.g., from a first input signal) during first sampling period 762 and providing the first portion of the chopped input signal to ADC 140 during second sampling period 764, with a second T/H circuit 130 receiving a second portion (e.g., polarity) of the chopped input signal during second sampling period 764 and providing the chopped input signal to ADC 140 during third sampling period 766, with a third T/H circuit 130 receiving a first portion (e.g., polarity) of a second chopped input signal (e.g., from a second input signal) during third sampling period 766 and providing the first portion of the second chopped input signal to ADC 140 during fourth sampling period 768, and with a fourth T/H circuit 130 receiving a second portion (e.g., polarity) of the second chopped input signal (e.g., from the second input signal) during fourth sampling period 768. For instance, where K=4, the chop period may be equal to $2 \times 4 \times t_s$, which is $8t_s$.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

What is claimed is:

1. An analog-to-digital conversion (ADC) circuit, comprising:

a first chop circuit configured to receive an input signal and generate a first polarity of the input signal during a first sampling period and a second polarity of the input signal during a second sampling period;

a first track-and-hold (T/H) circuit configured to acquire the first polarity of the input signal from the first chop circuit during the first sampling period and acquire the second polarity of the input signal from the first chop circuit during the second sampling period;

a second T/H circuit configured to output the second polarity of the input signal from the first chop circuit during the first sampling period and output the first polarity of the input signal from the first chop circuit during the second sampling period;

an ADC configured to convert the second polarity of the input signal from the second T/H circuit to one or more first digital bits during the first sampling period and convert the first polarity of the input signal from the second T/H circuit to one or more second digital bits during the second sampling period; and a second chop circuit configured to produce a digital representation of the input signal over the first sampling period and the second sampling period using the one or more first digital bits and the one or more second digital bits.

2. The ADC conversion circuit of claim 1, wherein:

the first T/H circuit is further configured to output the first polarity of the input signal from the first chop circuit during a third sampling period and output the second polarity of the input signal from the first chop circuit during a fourth sampling period; and the second T/H circuit is configured to acquire the first polarity of the input signal from the first chop circuit during the third sampling period and acquire the second polarity of the input signal from the first chop circuit during the fourth sampling period.

3. The ADC circuit of claim 1, wherein the first T/H circuit and the second T/H circuit are each coupled between the first chop circuit and the ADC.

4. The ADC circuit of claim 3, further comprising a signal conditioning circuit coupled between the first chop circuit and the first T/H circuit and between the first chop circuit and the second T/H circuit, wherein the signal conditioning circuit comprises a capacitive gain amplifier (CGA).

5. The ADC circuit of claim 1, further comprising:

a third chop circuit configured to receive a second input signal and generate a first polarity of the second input signal during a third sampling period and a second polarity of the second input signal during a fourth sampling period, wherein the first T/H circuit and the second T/H circuit are included in a plurality of T/H circuits, and the ADC circuit further comprises control circuitry configured to select among the plurality of T/H circuits to acquire one of the first polarity of the input signal, the second polarity of the input signal, the first polarity of the second input signal, and the second polarity of the second input signal.

6. The ADC circuit of claim 1, wherein the ADC comprises a successive approximation register (SAR) ADC.

7. The ADC circuit of claim 1, wherein the ADC circuit is further configured to:

transmit, over an isolation barrier, a modulated version of the digital representation of the input signal; and receive, over the isolation barrier, a clock signal for controlling timing of a transition between sampling periods.

8. The ADC circuit of claim 1, wherein:

the first chop circuit and the second chop circuit are configured to operate over a chop period that is longer than or equal to twice the first sampling period and the second sampling period; and the first T/H circuit and the second T/H circuit are configured to operate over a T/H period that is shorter than the chop period.

9. A method of analog-to-digital conversion (ADC), comprising:

during a first sampling period:

generating, using a first chop circuit, a first polarity of an input signal;

acquiring the first polarity of an input signal at a first track-and-hold (T/H) circuit; and converting, using an ADC, a second polarity of the input signal from a second T/H circuit to one or more first digital bits;

during a second sampling period:

generating, using the first chop circuit, the second polarity of the input signal;

acquiring the second polarity of the input signal at the first T/H circuit; and converting, using the ADC, the first polarity of the input signal from the second T/H circuit to one or more second digital bits; and producing, using a second chop circuit, a digital representation of the input signal over the first sampling period and the second sampling period using the one or more first digital bits and the one or more second digital bits.

10. The method of claim 9, further comprising:

during a third sampling period, acquiring the first polarity of the input signal at the second T/H circuit and converting, using the ADC, the first polarity of the input signal from the first T/H circuit to one or more third digital bits;

during a fourth sampling period, acquiring the second polarity of the input signal at the second T/H circuit and converting, using the ADC, the second polarity of the input signal from the first T/H circuit to one or more fourth digital bits; and producing, using the second chop circuit, the digital representation of the input signal over the third sampling period using the one or more third digital bits and over the fourth sampling period using the one or more fourth digital bits.

11. The method of claim 9, wherein the first T/H circuit and the second T/H circuit are each coupled between the first chop circuit and the ADC.

12. The method of claim 11, further comprising, using a capacitive gain amplifier (CGA) coupled between the first chop circuit and the first T/H circuit and between the first chop circuit and the second T/H circuit:

during the first sampling period, conditioning the first polarity of the input signal; and during the second sampling period, conditioning the second polarity of the input signal.

13. The method of claim 9, wherein further comprising:

transmitting, over an isolation barrier, a modulated version of the digital representation of the input signal; and receiving, over the isolation barrier, a clock signal for controlling timing of a transition between sampling periods.

14. The method of claim 9, wherein:

the first chop circuit and the second chop circuit operate over a chop period that is longer than or equal to the first sampling period and the second sampling period; and the first T/H circuit and the second T/H circuit operate over a T/H period that is shorter than the chop period.

15. An analog-to-digital conversion (ADC) circuit, comprising:

a first chop circuit configured to receive and chop an input signal to produce a chopped input signal;

a plurality of track-and-hold (T/H) circuits coupled to the first chop circuit to receive the chopped input signal and output a portion of the chopped input signal;

an ADC coupled to the plurality of T/H circuits to receive the portion of the chopped input signal and output a digital representation of the portion of the chopped input signal; and a second chop circuit coupled to the ADC and configured to output a digital representation of the input signal.

16. The ADC circuit of claim 15, further comprising a signal conditioning circuit coupled between the first chop circuit and the plurality of T/H circuits.

17. The ADC circuit of claim 16, wherein the signal conditioning circuit comprises a capacitive gain amplifier (CGA).

18. The ADC circuit of claim 15, wherein the ADC comprises a successive approximation register (SAR) ADC.

19. The ADC circuit of claim 15, wherein:

the first chop circuit and the second chop circuit are configured to receive a chop signal having a first frequency;

the ADC is configured to receive a conversion timing signal having a second frequency; and the second frequency is higher than the first frequency.

20. The ADC circuit of claim 15, further comprising:

transmission circuitry coupled to the second chop circuit and configured to transmit the digital representation of the input signal over an isolation barrier, wherein the ADC circuit is configured to receive a clock signal over the isolation barrier and operate the first chop circuit, the second chop circuit, and the ADC based on the clock signal.

* * * * *